(12) United States Patent
McPherson et al.

(10) Patent No.: US 7,906,405 B2
(45) Date of Patent: Mar. 15, 2011

(54) POLYSILICON STRUCTURES RESISTANT TO LASER ANNEAL LIGHTPIPE WAVEGUIDE EFFECTS

(75) Inventors: Joe W. McPherson, Plano, TX (US); Ajit Shanware, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 394 days.

(21) Appl. No.: 12/047,702

(22) Filed: Mar. 13, 2008

(65) Prior Publication Data

US 2009/0161290 A1    Jun. 25, 2009

Related U.S. Application Data

(60) Provisional application No. 61/016,530, filed on Dec. 24, 2007.

(51) Int. Cl.
*H01L 21/20* (2006.01)

(52) U.S. Cl. ........ 438/394; 438/381; 438/382; 438/535; 257/E21.004; 257/E21.008

(58) Field of Classification Search .............. 257/532, 257/E21.004, E21.008; 438/394, 381, 382, 438/535
See application file for complete search history.

(56) References Cited

U.S. PATENT DOCUMENTS

| | | | | |
|---|---|---|---|---|
| 6,441,339 | B1* | 8/2002 | Ueno | 219/121.65 |
| 7,442,625 | B2* | 10/2008 | Ito | 438/463 |
| 2002/0081799 | A1* | 6/2002 | Kim | 438/233 |
| 2005/0048779 | A1* | 3/2005 | Ito | 438/689 |
| 2007/0072382 | A1* | 3/2007 | Yamamoto et al. | 438/305 |
| 2007/0232039 | A1* | 10/2007 | Kubo et al. | 438/527 |
| 2007/0246796 | A1* | 10/2007 | Guo et al. | 257/529 |

* cited by examiner

*Primary Examiner* — Thanh V Pham
*Assistant Examiner* — Duy T Nguyen
(74) *Attorney, Agent, or Firm* — Warren L. Franz; Wade J. Brady, III; Frederick J. Telecky, Jr

(57) ABSTRACT

Laser scan annealing of integrated circuits offers advantages compared to rapid thermal annealing and furnace annealing, but can induce overheating in regions of components with polysilicon layers. Segmented polysilicon elements to reduce overheating is disclosed, as well as a method of forming components with segments polysilicon elements.

7 Claims, 7 Drawing Sheets

US 7,906,405 B2

POLYSILICON STRUCTURES RESISTANT TO LASER ANNEAL LIGHTPIPE WAVEGUIDE EFFECTS

FIELD OF THE INVENTION

This invention relates to the field of integrated circuits. More particularly, this invention relates to polysilicon structures in laser annealed integrated circuits.

BACKGROUND OF THE INVENTION

Integrated circuit (IC) fabrication processes include anneal operations to perform various functions, including activation of dopants and reduction of crystal lattice damage from ion implantation. Laser scan annealing, which involves irradiating a small region of an IC surface with light from a laser while scanning the irradiated region over the whole surface of the IC substrate, typically a wafer, is an annealing technique that has advantages over other annealing techniques, such as rapid thermal annealing or furnace annealing. Laser scan annealing is being used more frequently on ICs with structures smaller than 100 nanometers.

Defect mechanisms unique to laser scan annealing have been observed. One mechanism is degradation of gate oxide integrity in large polysilicon capacitors.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

This invention is a segmented polysilicon element of an electronic component in an integrated circuit. Segmentation results in reduced overheating during laser scan annealing. The electronic component may be a polysilicon capacitor, a MOS transistor, a varactor or a polysilicon resistor. A method of forming an integrated circuit including a component with segmented polysilicon is also claimed.

DETAILED DESCRIPTION

Figure 1A:
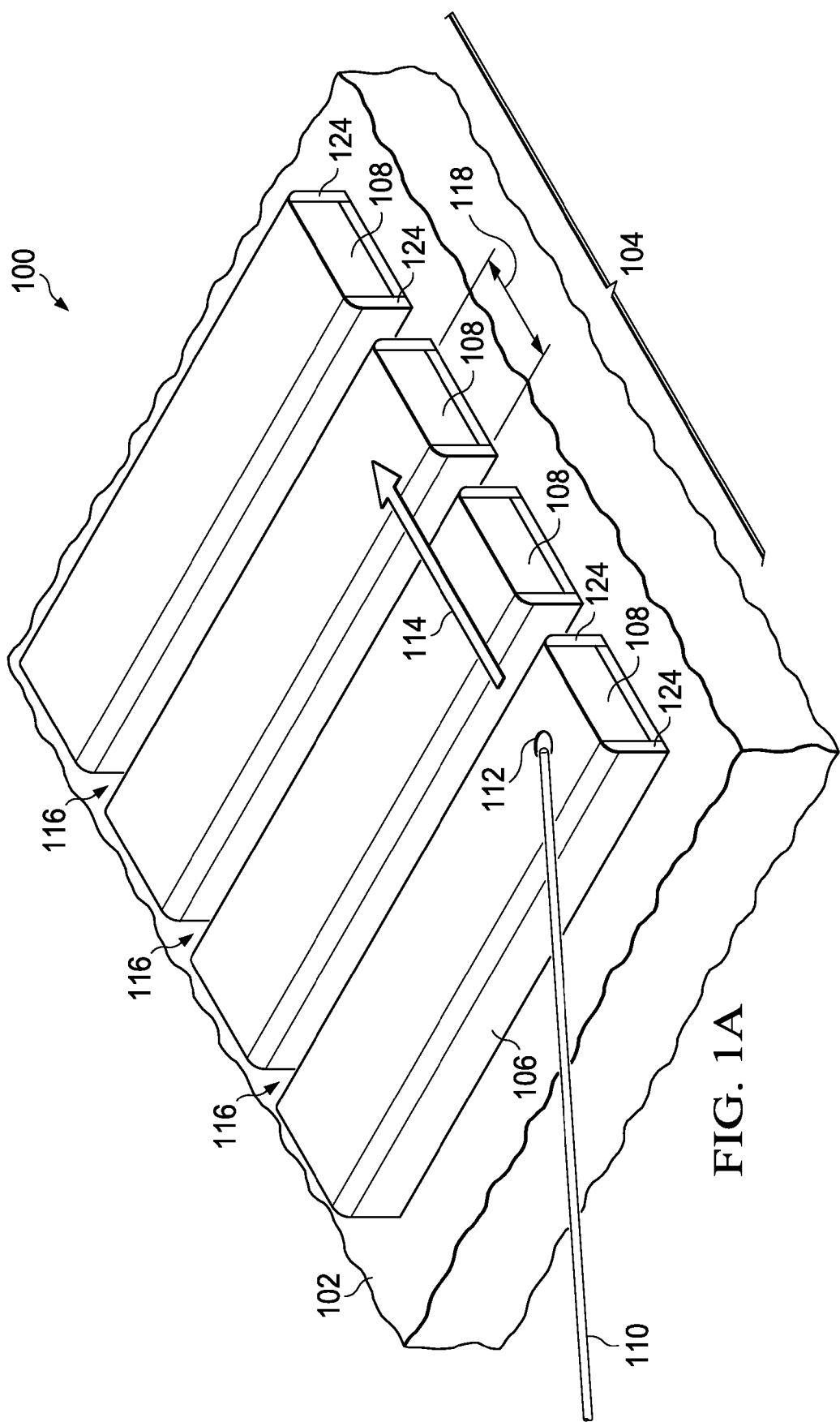
FIG. 1A, FIG. 1B and FIG. 1C are views of an IC with a polycrystalline silicon element during laser annealing and after contact formation, in accordance with a first embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "polysilicon" means polycrystalline silicon; the term "laser" means a coherent source of light of a given wavelength; and the term "laser beam" means light from a laser.

Figure 1B:
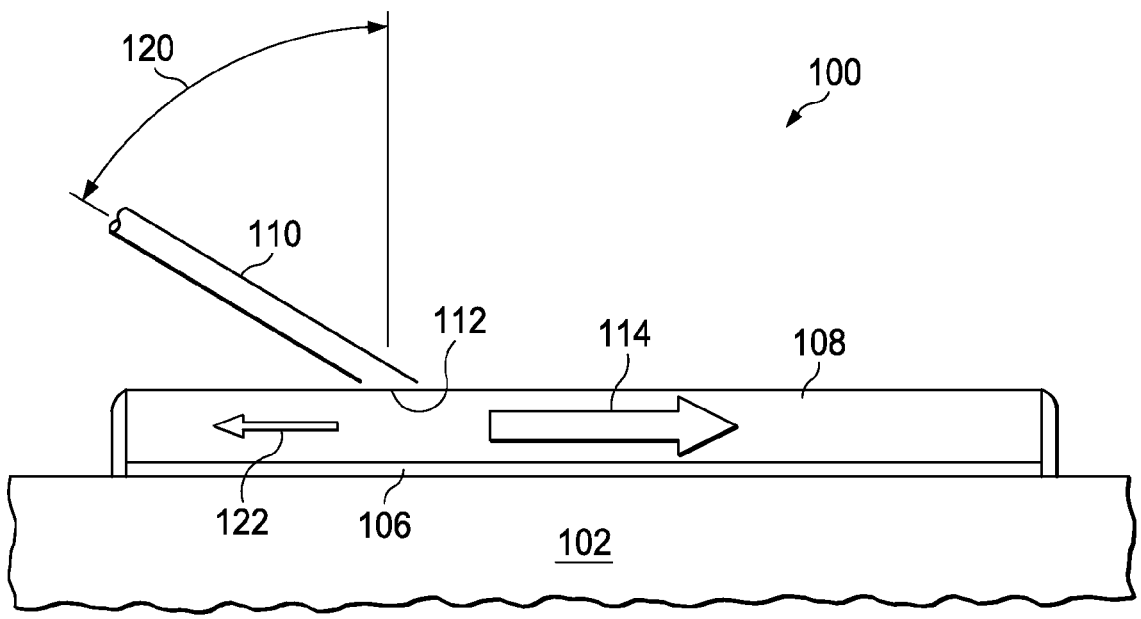
Figure 1C:
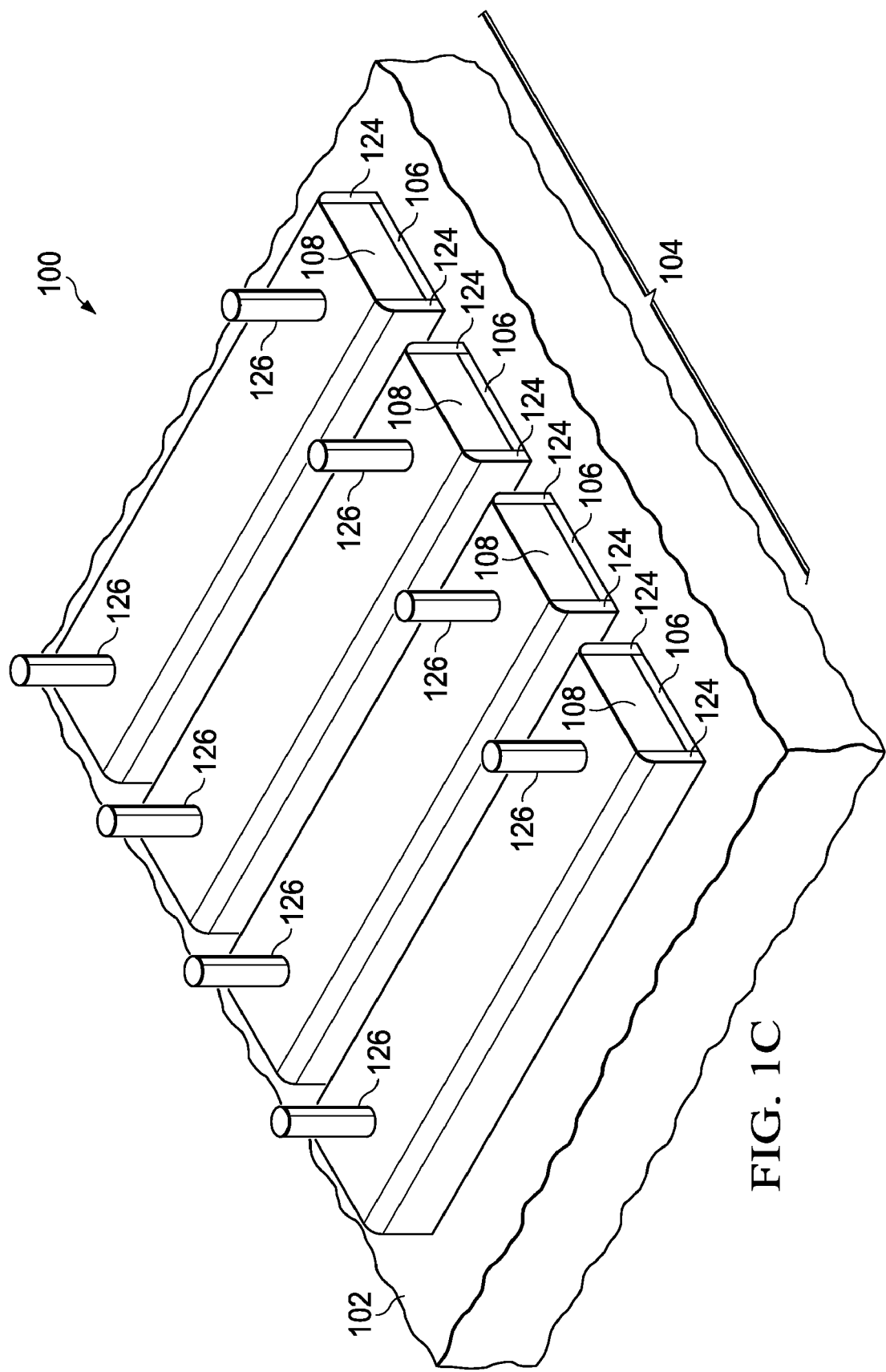

FIG. 1A, FIG. 1B and FIG. 1C are views of an IC with a polysilicon element during laser scan annealing and after contact formation, in accordance with a first embodiment of the instant invention.

FIG. 1A is a perspective view of an IC with a polysilicon element in accordance with a first embodiment of the instant invention. IC (100) includes a substrate (102) and a polysilicon element (104) on a top surface of the substrate (102). Polysilicon element (104) includes a dielectric layer (106), typically silicon dioxide, silicon oxy nitride, hafnium oxide or silicon nitride, formed on a top surface of the substrate (102), on which are formed strips of polysilicon (108), by depositing a layer of polysilicon, defining regions for the strips with a photoresist mask using photolithographic processes, and etching the polysilicon in regions not covered with the photoresist mask. Segmentation of the polysilicon into strips embodies the instant invention. After the polysilicon strips (108) are segmented, sidewall spacers (124) are formed by depositing spacer material, typically silicon nitride or layers of silicon dioxide and silicon nitride, in a conformal manner on a top surface of the IC (100), then etching the spacer material in an anisotropic manner such that the spacer material is removed from a top surface of the polysilicon strips (108) while a layer (124) remains on lateral surfaces of the polysilicon strips (108). Spacing between polysilicon strips (108) is typically prescribed by manufacturability issues relating to maintaining control of the sidewall spacer thickness. After the sidewall spacers (124) are formed, the IC (100) is ion implanted with dopants into the polysilicon strips and adjacent substrate. The IC (100) undergoes a laser scan annealing operation, in which a laser beam (110) irradiates a region (112) on a top surface of the IC (100). The laser beam (110) is scanned so that the irradiated region (112) moves across the top surface of the IC (100). The laser beam (110) is configured at an angle greater than 0 degrees from vertical and less than 90 degrees from vertical, typically approximately 75 degrees from vertical, where the top surface of the IC (100) is considered to be horizontal in this disclosure, to increase power transfer efficiency from the laser beam (110) to the polysilicon. Light from the laser beam (110) enters the polysilicon (108) at the irradiated region (112) and propagates laterally in the polysilicon (108) in a direction (114) away from the laser beam (110). This may be seen more clearly in FIG. 1B, a sectional view of the IC in which laser beam (110) is in the plane of the figure, at an angle (120) from vertical, which is greater than 0 degrees from vertical and less than 90 degrees from vertical, typically approximately 75 degrees from vertical. Light from the laser beam (110) enters a polysilicon strip (108) at a region (112). A majority of the power of the laser beam is propagated in the polysilicon (108)

in a direction (114) away from the region of irradiation (112), while a minority of the power of the laser beam propagates in the opposite lateral direction (120), toward the incoming laser beam. Direction (114) is denoted as "downstream" and the opposite lateral direction (122) is denoted as "upstream." The propagated light is partially absorbed by the polysilicon (108), which raises the temperature of the polysilicon (108). Downstream regions in a contiguous piece of polysilicon absorb laser light from direct irradiation and from downstream propagation, while upstream regions in the same contiguous piece of polysilicon absorb laser light from direct irradiation but less light from upstream propagation. Thus, downstream regions in a contiguous piece of polysilicon may be heated more during a laser scan anneal than upstream regions. Excess heating may cause degradation in a polysilicon capacitor, including reduction of electrical resistance in the dielectric (106), known as dielectric integrity. Referring back to FIG. 1A, in a first embodiment of the instant invention, the polysilicon element (104) is segmented in a direction perpendicular to the incoming laser beam (110) to prevent excess heating from downstream propagation. Segment gaps (116) reduce downstream propagation of laser light in the polysilicon strips (108) by reflecting the light internally from an interface between an end surface of the polysilicon and the sidewall spacers (124), and thus provide for more uniform heating in all the polysilicon strips (108) of the polysilicon element (104). Reduction of excess heating is advantageous because it reduces defects in the IC. A preferred segment width (118) is less than the characteristic absorption length, which is in the 1-100 micron range for highly doped polysilicon material.

Referring to FIG. 1C, a cut-away view of the IC, fabrication of IC (100) is continued with formation of a layer of dielectric material, typically silicon nitride, known as a pre-metal dielectric liner (PMD liner), which is deposited on a top surface of the IC (100), followed by a layer of dielectric material, typically silicon dioxide or phosphorus doped silicon dioxide, known as a pre-metal dielectric (PMD), on the PMD liner. The PMD liner and PMD are not shown in FIG. 1C for clarity. Following formation of the PMD, fabrication continues with formation of contacts (126), by depositing a layer of photoresist on a top surface of the PMD, defining regions for contacts in the photoresist layer by photolithographic processes, etching holes in the PMD and PMD liner in the regions defined by the photoresist layer, and depositing metal, typically tungsten, in the holes such that electrical contact is made between the contact metal and the underlying polysilicon strips (108).

Figure 2A:
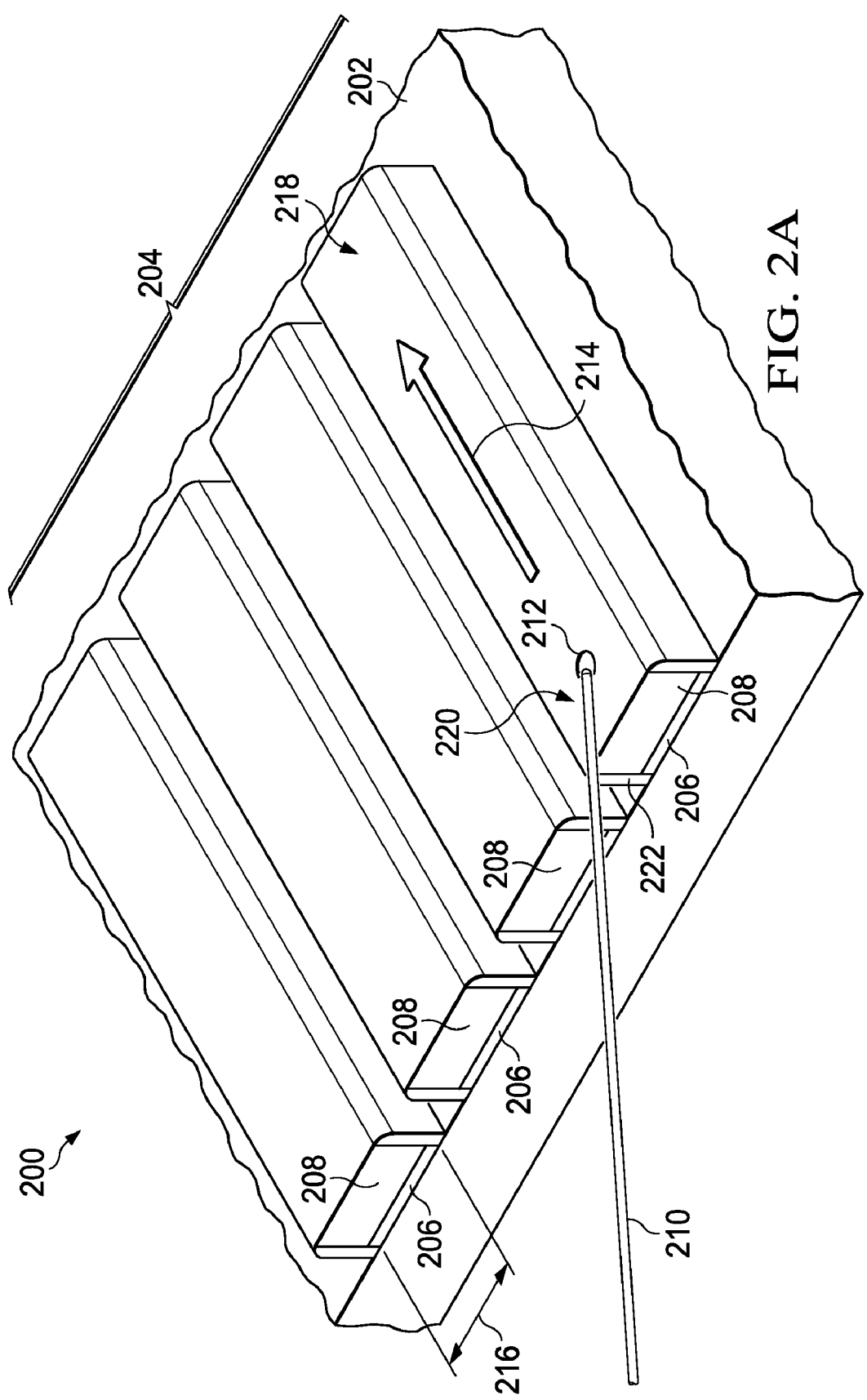
FIG. 2A and FIG. 2B are views of an IC with a polycrystalline silicon element during laser annealing and after contact formation, in accordance with a second embodiment of the instant invention.
Figure 2B:
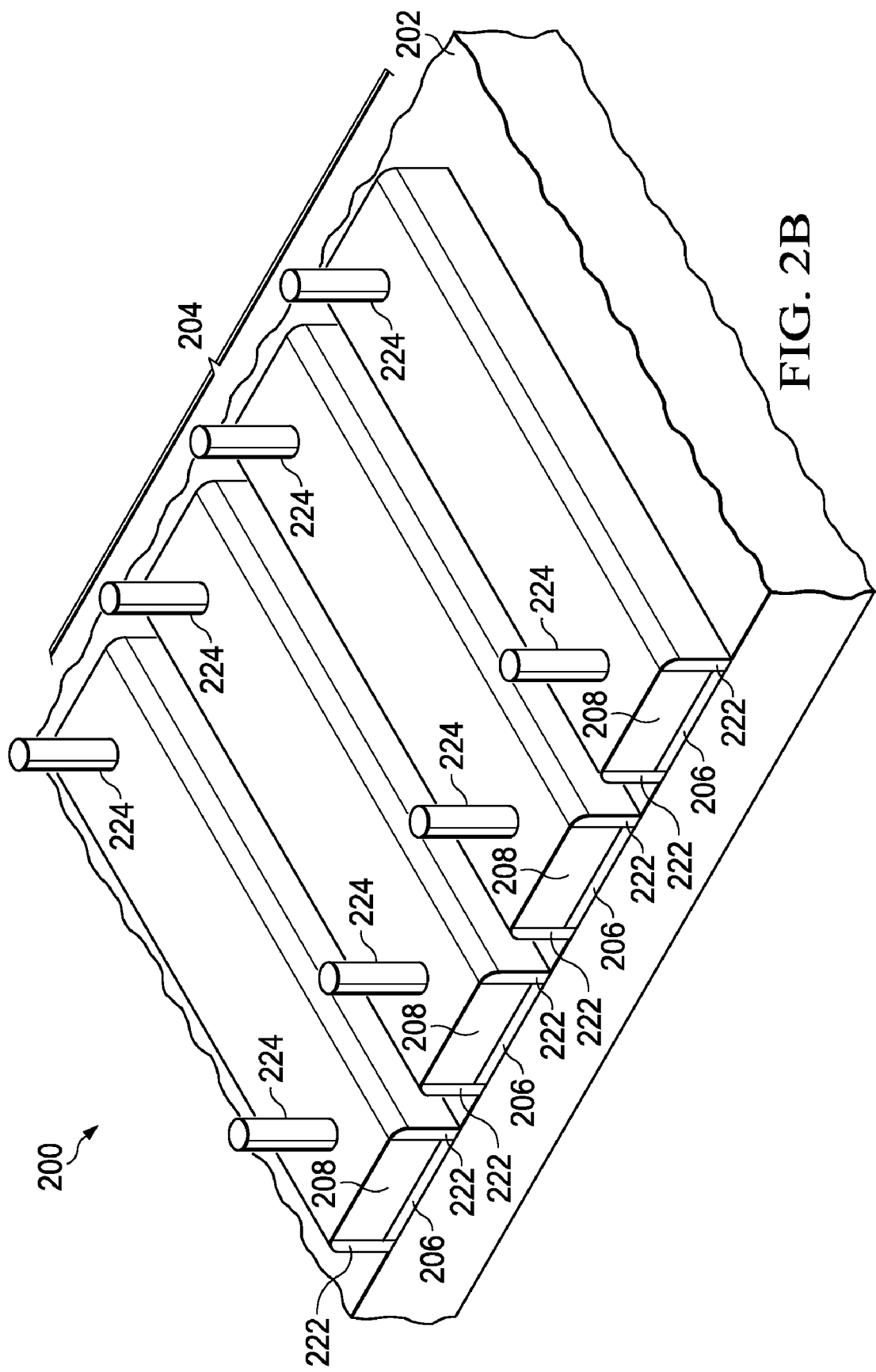

FIG. 2A and FIG. 2B are views of an IC with a polysilicon element during laser annealing and after contact formation, in accordance with a second embodiment of the instant invention.

FIG. 2A is a perspective view of an IC with a polysilicon element in accordance with a second embodiment of the instant invention. IC (200) includes a substrate (202) and a polysilicon element (204), which includes a dielectric layer (206), typically silicon dioxide, silicon oxy nitride, hafnium oxide or silicon nitride, on which are formed strips of polysilicon (208), by depositing of a layer of polysilicon, defining regions for the strips with a photoresist mask using photolithographic processes, and etching the polysilicon in regions not covered with the photoresist mask. Segmentation of the polysilicon into strips embodies the instant invention. After the polysilicon strips (208) are segmented, sidewall spacers (222) are formed by depositing spacer material, typically silicon nitride or layers of silicon dioxide and silicon nitride, in a conformal manner on a top surface of the IC (200), then etching the spacer material in an anisotropic manner such that the spacer material is removed from a top surface of the polysilicon strips (208) while a layer (222) remains on lateral surfaces of the polysilicon strips (208). Spacing between polysilicon strips (208) is typically prescribed by manufacturability issues relating to maintaining control of the sidewall spacer thickness. After the sidewall spacers (222) are formed, the IC (200) is ion implanted with dopants into the polysilicon strips and adjacent substrate. The IC (200) undergoes a laser scan annealing operation, in which a laser beam (210) irradiates a region (212) on a top surface of the IC (200). The laser beam is scanned so that the irradiated region (212) moves across the top surface of the IC (200). The laser beam (210) is configured at an angle greater than 0 degrees from vertical and less than 90 degrees from vertical, typically approximately 75 degrees from vertical, where the top surface of the IC (200) is considered to be horizontal in this disclosure, to increase the power transfer efficiency from the laser beam (210) to the polysilicon. Light from the laser beam (210) enters the polysilicon (208) at the irradiated region (212) and propagates laterally in the polysilicon (208) in a direction (214) away from the laser beam (210). Direction (214) is denoted as "downstream" and the opposite lateral direction, toward the incoming laser beam, is denoted as "upstream." The propagated light is absorbed by the polysilicon (208), which raises the temperature of the polysilicon (208). Downstream regions (218) in a contiguous piece of polysilicon (208) absorb laser light from direct irradiation and from downstream propagation, while upstream regions (220) in the same contiguous piece of polysilicon (208) absorb laser light from direct irradiation but less light from propagation. Thus, a downstream region (218) in a contiguous piece of polysilicon (208) may be heated more during a laser scan anneal than an upstream region (220). Excess heating may cause degradation in a polysilicon element, including reduction of dielectric integrity in the dielectric (206). In a second embodiment of the instant invention, the polysilicon (208) is segmented in a direction parallel to the incoming laser beam (210) to prevent excess heating from downstream propagation. A lateral width (216) of each polysilicon segment may be set less than the wavelength of the laser beam light divided by twice an index of refraction of polysilicon (at the laser beam light wavelength) to reduce lateral propagation. For example, a laser beam of 10.6+/−0.2 micron wavelength light is used, and the index of refraction of polysilicon at 10.6 microns wavelength is 3.5, and a segment width less than 10.6/(2·3.5)≈1.5 microns would reduce lateral propagation of laser beam light in that segment. Thus, segmented polysilicon parallel to the incoming laser beam, with segment widths less than wavelength divided by twice the index of refraction provide for more uniform heating in all the polysilicon segments (208). Reduction of excess heating is advantageous because it reduces defects in the IC.

FIG. 2B is a cut-away view of the IC. Fabrication of the IC (200) is continued after the laser scan anneal process by formation of a layer of dielectric material, typically silicon nitride, known as a pre-metal dielectric liner (PMD liner), which is deposited on a top surface of the IC (200), followed by a layer of dielectric material, typically silicon dioxide or phosphorus doped silicon dioxide, known as a pre-metal dielectric (PMD), on the PMD liner. The PMD liner and PMD are not shown in FIG. 2B for clarity. Following formation of the PMD, fabrication continues with formation of contacts (224), by depositing a layer of photoresist on a top surface of the PMD, defining regions for contacts in the photoresist layer by photolithographic processes, etching holes in the PMD and PMD liner in the regions defined by the photoresist layer, and depositing metal, typically tungsten, in the holes such that electrical contact is made between the contact metal and the underlying polysilicon strips (208).

It is within the scope of this invention for laser scan annealing to be performed at other points in the fabrication sequence, including after formation of sidewall spacers.

The advantages of segmenting polysilicon elements may also be realized in electronic components in ICs which include large regions of polysilicon on dielectric layers. For example polysilicon capacitors, varactors (variable reactance capacitors) and MOS transistors and with lateral dimensions larger than the segment widths discussed above may benefit from segmentation as described in the first two embodiments of the instant invention.

Figure 3:
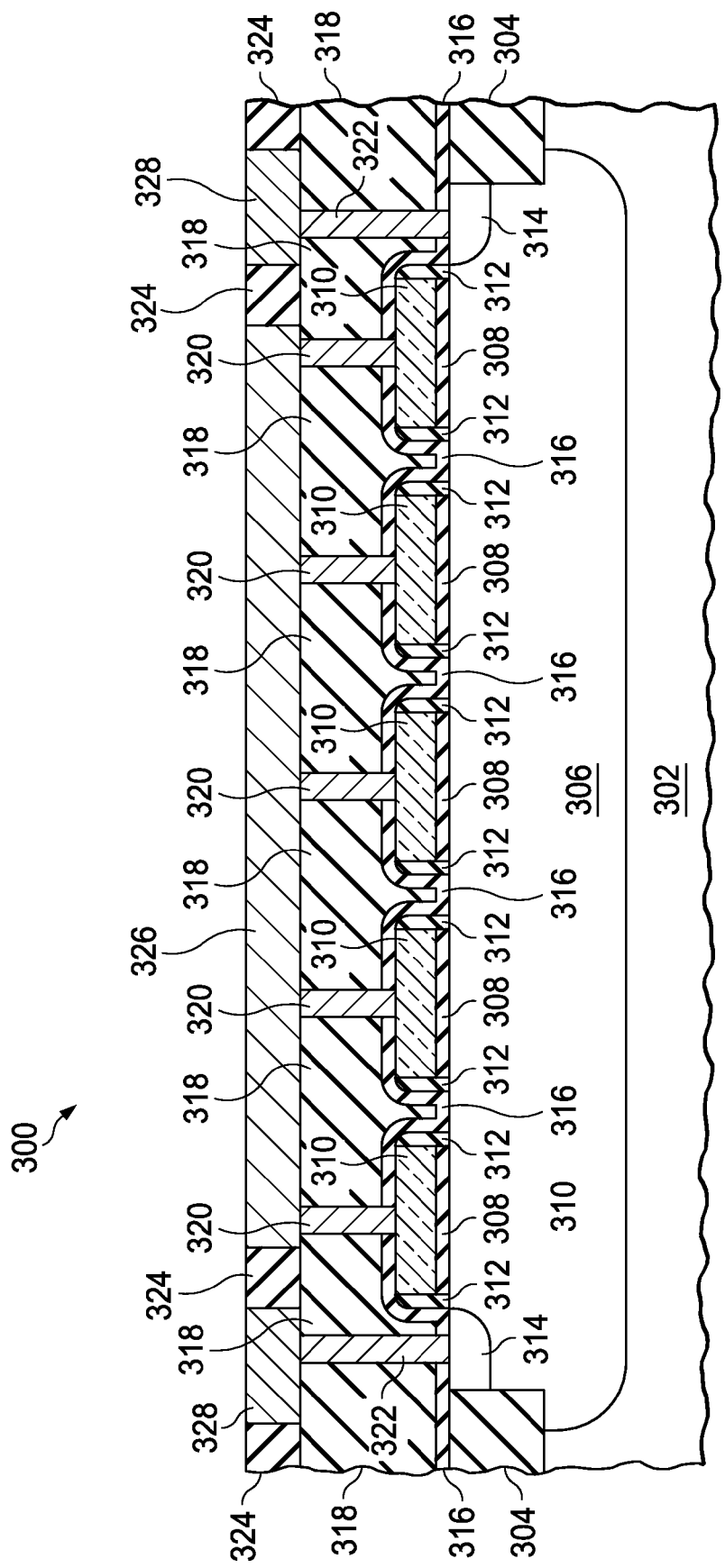
FIG. 3 is a cross-sectional view of an IC with a polysilicon capacitor in accordance with an embodiment of the instant invention.

FIG. 3 is a cross-sectional view of an IC with a polysilicon capacitor in accordance with an embodiment of the instant invention. IC (300) includes a substrate (302), typically p-type silicon, in which regions of field oxide (304), typically silicon dioxide formed by Local Oxidation of Silicon (LOCOS) or Shallow Trench Isolation (STI), are formed. A region of n-type silicon (306), known as an n-well, is formed in the substrate (302) and extending to the surface of the substrate (302), typically by ion implantation of phosphorus and subsequent annealing. A dielectric layer (308), typically silicon dioxide, silicon oxy nitride, hafnium oxide or silicon nitride, is formed on a top surface of the n-well (306). Strips of polysilicon (310) are formed on a top surface of the dielectric layer (308) by depositing of a layer of polysilicon, defining regions for the strips with a photoresist mask using photolithographic processes, and etching the polysilicon in regions not covered with the photoresist mask. Segmentation of the polysilicon into strips embodies the instant invention. After the polysilicon strips (310) are formed, the IC (300) undergoes a laser scan annealing operation, as discussed above in reference to FIG. 1A and FIG. 2A. Sidewall spacers (312), are formed by depositing spacer material, typically silicon nitride or layers of silicon dioxide and silicon nitride, in a conformal manner on a top surface of the IC (300), then etching the spacer material in an anisotropic manner such that the spacer material is removed from a top surface of the polysilicon strips (310) while a layer (312) remains on lateral surfaces of the polysilicon strips (310). Spacing between polysilicon strips (310) is typically prescribed by manufacturability issues relating to maintaining control of the sidewall spacer thickness. Following formation of the sidewall spacers (312), substrate contact diffused regions (314) are formed by ion implantation of a dopant species, typically phosphorus or arsenic or both, at doses ranging from $10^{14}$ to $10^{16}$ cm$^{-2}$, followed by an anneal operation, possibly a laser scan anneal operation. After formation of the substrate contact diffused regions (314), a layer of dielectric material (316), typically silicon nitride, known as a pre-metal dielectric liner (PMD liner), is deposited on a top surface of the IC (300), followed by a layer of dielectric material (318), typically silicon dioxide or phosphorus doped silicon dioxide, known as a pre-metal dielectric (PMD), on the PMD liner. Following formation of the PMD, fabrication continues with formation of polysilicon contacts (320) and substrate contacts (322), by depositing a layer of photoresist on a top surface of the PMD, defining regions for contacts in the photoresist layer by photolithographic processes, etching holes in the PMD (318) and PMD liner (316) in the regions defined by the photoresist layer, and depositing and selectively removing metal, typically tungsten, in the holes such that electrical contact is made between the contact metal and the underlying polysilicon strips (310). Fabrication continues with deposition of an intra-level-dielectric layer (324), known as the ILD, typically low-k dielectric material such as organo-silicate glass. Metal interconnect lines are formed in the ILD (324) by depositing a layer of photoresist on a top surface of the ILD, defining regions for metal lines in the photoresist layer by photolithographic processes, etching trenches in the ILD (324) down to the tops of the contacts (320, 322) in the regions defined by the photoresist layer, depositing and selectively removing a liner metal and a fill metal, typically copper, to produce a polysilicon metal interconnect line (326) and substrate metal interconnect lines (328). The capacitor formed by the dielectric layer (308), polysilicon strips (320), the substrate (302), the substrate contact diffused regions (314), polysilicon contacts (320), substrate contacts (322), polysilicon metal interconnect line (326) and substrate metal interconnect lines (328) is electrically equivalent to a capacitor formed of a monolithic piece of polysilicon, with the advantage of being resistant to degradation of the dielectric layer (308) during laser scan anneal operations.

It will be recognized by practitioners of IC fabrication that the polysilicon capacitor embodiment discussed above applies to capacitors fabricated on p-wells, with appropriate changes in polarity of the various dopants.

Another component that may benefit from segmentation is a polysilicon resistor. Electrical resistance of a polysilicon resistor is affected by activation of dopants in the polysilicon. Segmentation, as discussed above, may reduce excess heating during laser scan annealing which may change the activation of the dopants, and hence change the electrical resistance of the resistor from its desired value.

Figure 4:
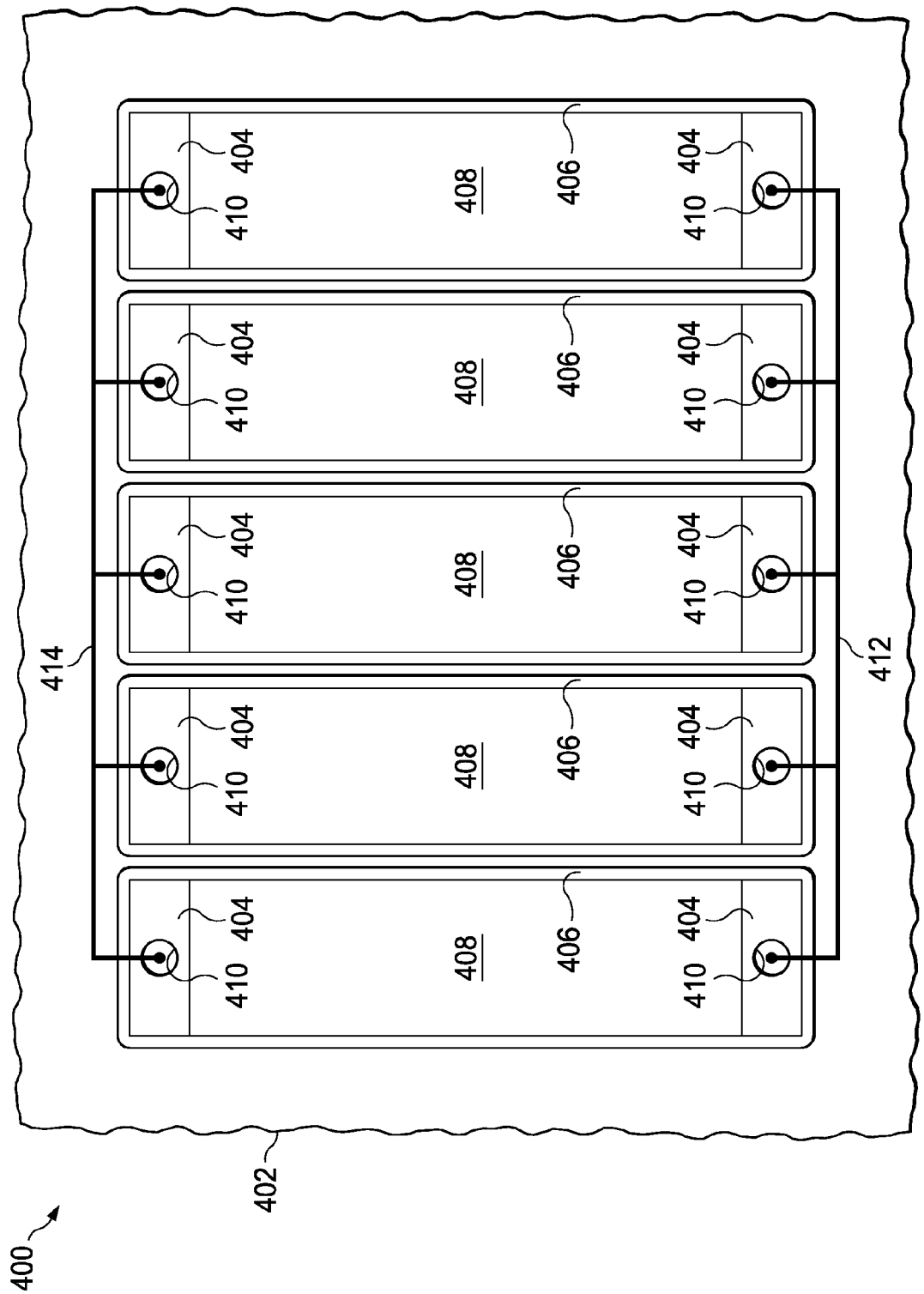
FIG. 4 is a top view of an IC with a polysilicon resistor in accordance with an embodiment of the instant invention.

FIG. 4 is a top view of an IC with a polysilicon resistor in accordance with an embodiment of the instant invention. An IC (400) includes a substrate (not shown in FIG. 4 for clarity) in which are formed regions of field oxide (402), typically silicon dioxide formed by Local Oxidation of Silicon (LOCOS) or Shallow Trench Isolation (STI). Strips of polysilicon for resistor elements (404) of the polysilicon resistor are formed on a top surface of the field oxide (402) by depositing of a layer of polysilicon, defining regions for the strips with a photoresist mask using photolithographic processes, and etching the polysilicon in regions not covered with the photoresist mask. Segmentation of the polysilicon into strips embodies the instant invention. After the resistor elements (404) are formed, the resistor elements (404) are implanted with n-type or p-type dopants. Dopant species, doses and implant energies for polysilicon resistors vary widely, depending on the design parameters of the instant resistor. Following implantation, the IC (400) undergoes a laser scan annealing operation, as discussed above in reference to FIG. 1A and FIG. 2A. In this embodiment, segmentation of the polysilicon is advantageous because it reduces overheating caused by lateral propagation of the laser light in the polysilicon, which can cause non-uniform conductivity in the resistor elements (404). Sidewall spacers (406), are formed by depositing spacer material, typically silicon nitride or layers of silicon dioxide and silicon nitride, in a conformal manner on a top surface of the IC (400), then etching the spacer material in an anisotropic manner such that the spacer material is removed from a top surface of the resistor elements (404) while a layer (406) remains on lateral surfaces of the resistor elements (404). In some embodiments, a photoresist mask on the spacer material defining body regions (408) in the resistor elements (404) may be formed before the spacer material is anisotropically etched, in order to provide a protective layer over the body regions (408). Spacing between resistor elements (404) is typically prescribed by manufacturability issues relating to maintaining control of the sidewall spacer thickness. Following formation of the sidewall spacers (406), a layer of dielectric material (not shown in FIG. 4 for clarity), typically silicon nitride, known as a pre-metal dielectric liner (PMD liner), is deposited on a top surface of the IC (400), followed by a layer of dielectric material (not shown in FIG. 4 for clarity), typically silicon dioxide or phosphorus doped silicon dioxide, known as a pre-metal dielectric (PMD), on the PMD liner. Following formation of the PMD, fabrication continues with formation of resistor contacts (410), by depositing a layer of photoresist on a top surface of the PMD, defining regions for contacts in the photoresist layer by photolithographic processes, etching holes in the PMD and PMD liner in the regions defined by the photoresist layer, and depositing and selectively removing metal, typically tungsten, in the holes such that electrical contact is made between the contact metal and the underlying resistor elements (404). Fabrication continues with deposition of an intra-level-dielectric layer (not shown in FIG. 4 for clarity), known as the ILD, typically low-k dielectric material such as organo-silicate glass. Metal interconnect lines are formed in the ILD by depositing a layer of photoresist on a top surface of the ILD, defining regions for metal lines in the photoresist layer by photolithographic processes, etching trenches in the ILD down to the tops of the contacts (410) in the regions defined by the photoresist layer, depositing and selectively removing a liner metal and a fill metal, typically copper, to produce a first resistor terminal metal interconnect line (shown schematically by 612), and a second resistor terminal metal interconnect lines (shown schematically by 614). The polysilicon resistor formed by the resistor elements (404), resistor body regions (408), resistor contacts (410), and resistor terminal metal interconnect lines (412, 614 is electrically equivalent to a polysilicon resistor formed of a monolithic piece of polysilicon, with the advantage of being resistant to spatially non-uniform changes in conductivity during laser scan anneal operations.

What is claimed is:

1. A method of forming an integrated circuit device, comprising:

forming a dielectric layer over a substrate;

forming a polysilicon layer over the dielectric layer;

segmenting the polysilicon layer into strips of given width separated by segment gaps;

forming sidewall spacers on lateral surfaces of the strips;

implanting the polysilicon strips and adjacent areas of the substrate with dopants;

performing a laser scan anneal by moving a laser beam of given wavelength at an acute angle incident to a top surface of the segmented polysilicon layer in a scan of the top surface with the laser beam moving directed parallel to the lateral surfaces of the strips; the given width being less than the given wavelength divided by twice an index of refraction of polysilicon at the given wavelength;

forming a pre-metal dielectric layer over the annealed polysilicon strips; and forming contacts through the pre-metal dielectric layer for establishing contact with the underlying polysilicon strips.

2. The method of claim 1, wherein the polysilicon layer is segmented by defining regions for the strips with a photoresist mask, and etching the polysilicon layer in regions not covered with the photoresist mask.

3. The method of claim 1, wherein the substrate is a silicon substrate of n or p type conductivity with a well region of opposite n or p type conductivity formed between isolation regions therein; the strips are formed over the dielectric layer over the well region; a metal interconnect layer is formed over the pre-metal dielectric layer; and the contacts are formed through the pre-metal dielectric layer between the metal interconnect layer and the strips.

4. The method of claim 3, wherein first contacts are formed through the pre-metal dielectric layer between a first portion of the metal interconnect layer and first ends of the strips; and second contacts are formed between a second portion of the metal interconnect layer and second ends of the strips.

5. The method of claim 4, wherein the integrated circuit device comprises a polysilicon resistor; the first contacts and first portion of the metal interconnect layer define a first resistor terminal metal interconnect line; and the second contacts and second portion of the metal interconnect layer define a second resistor terminal metal interconnect line.

6. The method of claim 3, wherein contact diffused regions are formed in the well region adjacent the strips; first contacts are formed between a first portion of the metal interconnect layer and the strips; and second contacts are formed between a second portion of the metal interconnect layer and the contact diffused regions.

7. The method of claim 6, wherein the integrated circuit device comprises a polysilicon capacitor; the first contacts and first portion of the metal interconnect layer define a first capacitor plate connection; and the second contacts and second portion of the metal interconnect layer define a second capacitor plate connection.

* * * * *